United States Patent [19]

Ishibashi

[11] Patent Number: 5,783,950
[45] Date of Patent: Jul. 21, 1998

[54] PHASE COMPARATOR

[75] Inventor: Atsuhiko Ishibashi, Hyogo, Japan

[73] Assignee: Mitsubishi Denki Kabushiki Kaisha, Tokyo, Japan

[21] Appl. No.: 939,124

[22] Filed: Sep. 26, 1997

Related U.S. Application Data

[63] Continuation of Ser. No. 677,754, Jul. 10, 1996, abandoned, which is a continuation of Ser. No. 463,416, Jun. 5, 1995, abandoned.

[30]     Foreign Application Priority Data

Oct. 14, 1994  [JP]  Japan .................................. 6-249310

[51] Int. Cl.$^6$ .................................................. H03K 19/003
[52] U.S. Cl. ............................. 327/12; 327/142; 327/156; 326/104
[58] Field of Search .................. 327/12, 142, 198, 327/147, 156, 3, 5; 326/114, 104, 112, 119, 121, 122

[56]            References Cited

U.S. PATENT DOCUMENTS 3,610,954  10/1971  Treadway .
3,986,043  10/1976  Buckley, III et al. .................. 326/114
5,274,277  12/1993  Chan ........................................ 326/104

FOREIGN PATENT DOCUMENTS 2-309815  12/1990  Japan .
3-30517   2/1991   Japan .
3129921   6/1991   Japan .................................. 326/121
6224739   8/1994   Japan .................................. 326/121

Primary Examiner—Timothy P. Callahan
Assistant Examiner—Eunja Shin
Attorney, Agent, or Firm—McDermott, Will & Emery

[57]            ABSTRACT

A reset signal generating circuit included in a phase comparator of a PLL circuit includes fourth and second transistors having their respective gates connected to the gates of first and third transistors in a crossed form. A reset signal is output through first and third transistors and through fourth and second transistors in response to output of signals UP and DOWN. Accordingly, the time period between the output of signals UP, DOWN, and the output of the reset signal is made constant regardless of which of the signals UP and DOWN has been output first.

2 Claims, 5 Drawing Sheets

PHASE COMPARATOR

This application is a continuation of application Ser. No. 08/677,754 filed Jul. 10, 1996, now abandoned, which is a continuation of application Ser. No. 08/463,416, filed Jun. 5, 1995, now abandoned.

BACKGROUND OF THE INVENTION

1. Field of the Invention

The present invention relates to a phase comparator. More particularly, the present invention relates to a phase comparator for comparing a first clock signal and a second clock signal, outputting a first control signal in response to the lead of the phase of the first clock signal, and outputting a second control signal corresponding to the lead of the phase of the second clock signal.

2. Description of the Background Art

Figure 5:
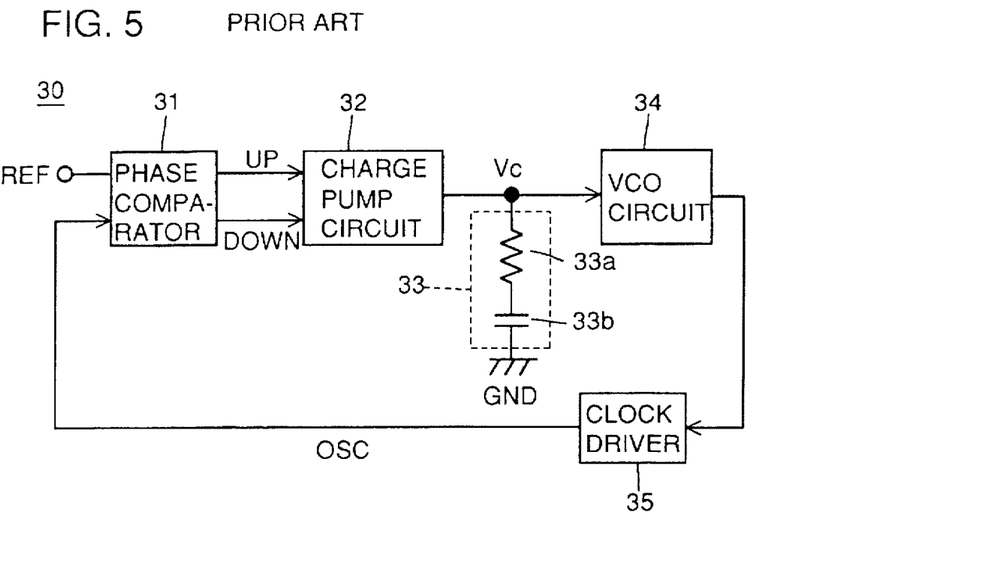
FIG. 5 is a circuit block diagram showing a structure of a conventional PLL circuit.

Description is made first on a phase locked loop (hereinafter represented by the abbreviation PLL) circuit in which a phase comparator is utilized. FIG. 5 is a circuit block diagram showing a structure of a conventional PLL circuit 30 described in Japanese Patent Laying-Open No. 3-30517. Referring to FIG. 5, this PLL circuit 30 includes a phase comparator 31, a charge pump circuit 32, a loop filter 33, a voltage controlled oscillator (hereinafter referred to as VCO circuit) 34, and a clock driver 35.

Phase comparator 31 compares the phases of the fall of an external clock signal REF which is the reference of the phase lock and the fall of an internal clock signal OSC applied from clock driver 35, outputs a signal UP when the phase of external clock signal REF is in advance of internal clock signal OSC, and a signal DOWN when internal clock signal OSC is in advance of external clock signal REF. Here, if the difference between the compared frequencies or phases is large, the pulse width of signal UP and signal DOWN would be also large.

Charge pump circuit 32 receives signal UP or signal DOWN and supplies positive or negative charges to loop filter 33 by an amount corresponding to the pulse width of each signal. Loop filter 33 includes a resistor 33a and a capacitor 33b, integrates the amount of the positive or negative charges output from charge pump circuit 32, and outputs a control voltage Vc of a value corresponding to the integration value. The resistance value of resistor 33a and capacitance of capacitor 33b are set so that control voltage Vc would change gradually and not rapidly.

VCO circuit 34 oscillates at a frequency corresponding to control voltage Vc received from loop filter 33. The frequency is made higher when the control voltage Vc is increased, and is made lower when control voltage Vc is reduced. Clock driver 35 amplifies the oscillation signal output from VCO circuit 34 and supplies the amplified signal internally to the integrated circuit. Thus, output of clock driver 35 would be internal clock signal OSC.

The operation of this PLL circuit 30 will now be described. When the phase of internal clock signal OSC lags behind external clock signal REF, phase comparator 31 outputs signal UP with a pulse width corresponding to the phase difference between external clock signal REF and internal clock signal OSC. Correspondingly, charge pump circuit 32 supplies positive charge to loop filter 33 so as to increase control voltage Vc and thus causes increase in oscillation frequency of VCO circuit 34. Accordingly, frequency of internal clock signal OSC is made higher while the phase difference between external clock signal REF and internal clock signal OSC is reduced.

2

On the contrary, when the phase of internal clock signal OSC is in advance of external clock signal REF, phase comparator 31 outputs signal DOWN with a pulse width corresponding to the phase difference between internal clock signal REF and external clock signal OSC. Correspondingly, charge pump circuit 32 supplies negative charge to loop filter 33 and thus control voltage Vc is made lower so as to reduce oscillation frequency of VCO circuit 34. Accordingly, frequency of internal clock signal OSC is made lower and the phase difference between internal clock signal OSC and external clock signal REF is reduced.

The above process is repeated until the frequencies and phases of internal clock signal OSC and external clock signal REF finally coincide with one another. Under this condition, amount of charges supplied to loop filter 33 by charge pump circuit 32 is extremely low. In addition, when this amount of charges is integrated at loop filter 33, control voltage Vc which is the output of loop filter 33 is hardly changed. Accordingly, VCO circuit 34 and clock driver 35 continue to output internal clock signal OSC having a frequency and a phase matching to those of external clock signal REF, maintaining a synchronized state.

Figure 6:
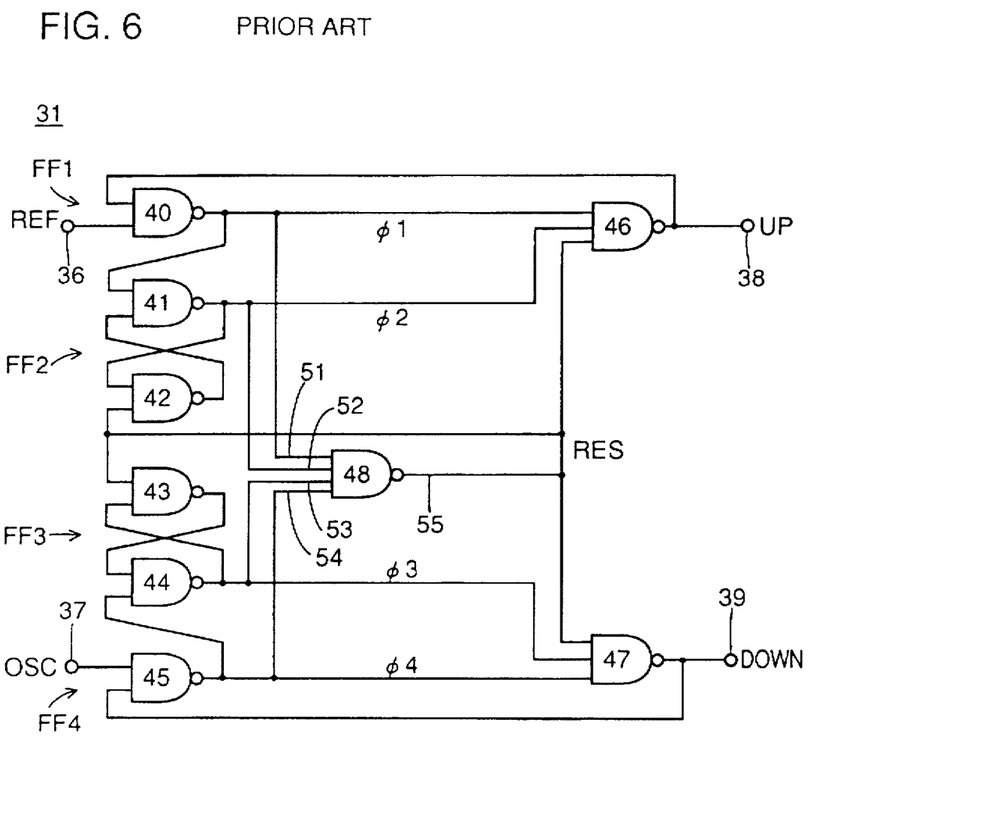
FIG. 6 is a circuit diagram showing a structure of a phase comparator in the PLL circuit shown in FIG. 5.

Phase comparator 31 shown in FIG. 5 will now be described in detail. FIG. 6 is a circuit diagram showing a structure of a conventional phase comparator 31 such as those described in, for example, Japanese Patent Laying-Open No. 3-30517 and U.S. Pat. No. 3,610,954. Referring to FIG. 6, this phase comparator 31 includes input terminals 36 and 37, output terminals 38 and 39, 2-input NAND gates 40 to 45, 3-input NAND gates 46 and 47, and a 4-input NAND gate 48.

To input terminals 36 and 37, external clock signal REF and internal clock signal OSC are input, respectively. NAND gate 40 receives external clock signal REF input to input terminal 36 as well as output of NAND gate 46, and outputs a signal 41. NAND gate 41 receives outputs of NAND gates 40 and 42, and outputs a signal 42. NAND gate 42 receives outputs of NAND gates 41 and 48, while NAND gate 43 receives outputs of NAND gates 44 and 48. NAND gate 44 receives outputs from NAND gates 43 and 45 and outputs a signal 43. NAND gate 45 receives internal clock signal OSC input to input terminal 37 as well as output from NAND gate 47, outputs a signal φ4.

NAND gate 48 receives signals φ1 to φ4 from NAND gates 40, 41, 44, and 45, and outputs a reset signal RES. NAND gate 46 receives signals φ1, φ2, and RES from NAND gates 40, 41, and 48 and outputs signal UP to output terminal 38. NAND gate 47 receives signals φ3, φ4, and RES from NAND gates 44, 45, and 48 and outputs signal DOWN to output terminal 39.

In other words, NAND gates 40 and 46, 41 and 42, 43 and 44, and 45 and 47 constitute flip-flops FF1 to FF4, respectively. Flip-flop FF1 is set by external clock signal REF, and is reset by a logical product signal of output signal φ2 of flip-flop FF2 and reset signal RES, and its inverted output becomes signal UP. Flip-flop FF2 is set by output signal φ1 of flip-flop FF1 and is reset by reset signal RES.

Flip-flop FF3 is set by output signal 44 of flip-flop FF4, and is reset by reset signal RES. Flip-flop FF4 is set by internal clock signal OSC and is reset by a logical product signal of output signal φ3 from flip-flop FF3 and reset signal RES, and its inverted output becomes signal DOWN. 4-input NAND gate 48 receives output signals φ1 to φ4 of flip-flops FF1 to FF4, and outputs reset signal RES.

Phase comparator 31 compares the phases of external clock signal REF applied to input terminal 36 and internal clock signal OSC applied to input terminal 37. When the phase of internal clock signal OSC lags behind external clock signal REF, phase comparator 31 outputs signal UP with a pulse width corresponding to the phase difference to output terminal 38, and when the phase of internal clock signal OSC is in advance of external clock signal REF, it outputs signal DOWN with a pulse width corresponding to the phase difference to output terminal 39. This operation will be described hereinbelow.

Figure 7:
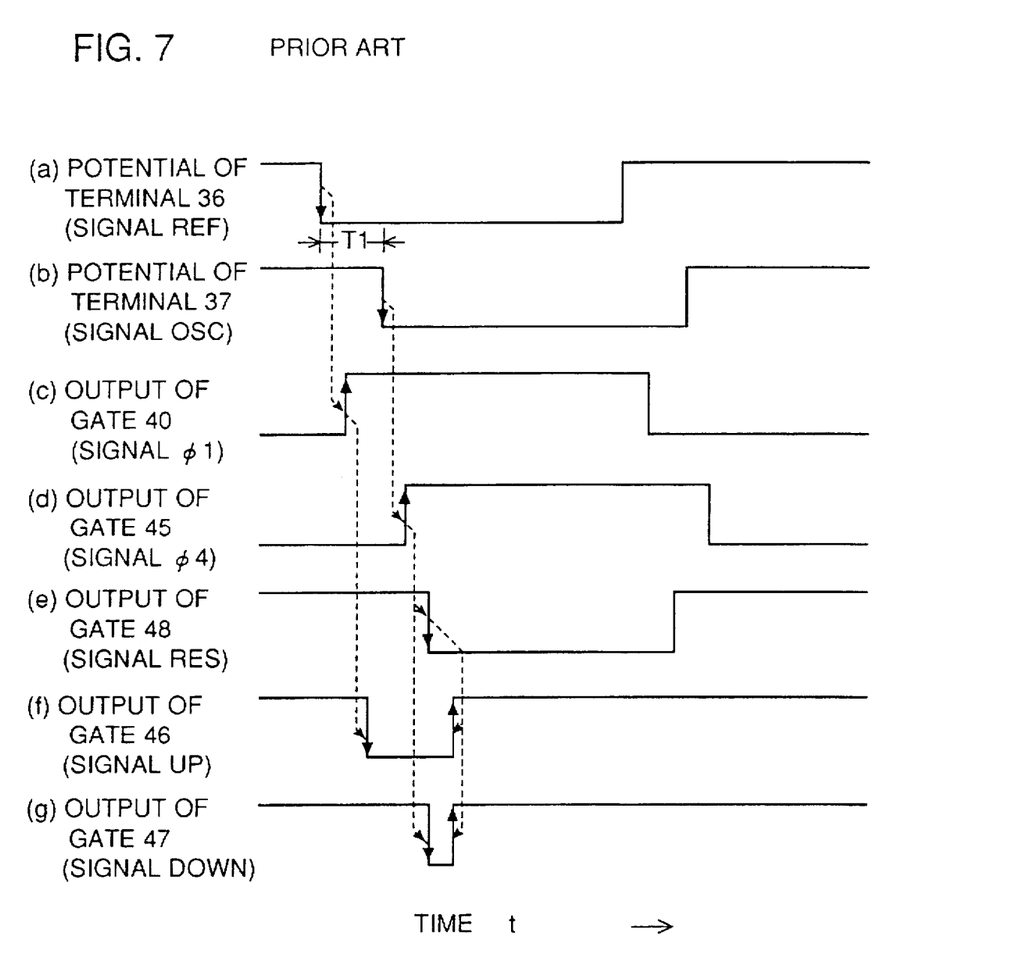
FIG. 7 is a timing chart for the operation of the phase comparator shown in FIG. 6.

FIG. 7 is a timing chart showing the relationship of the potential applied to input terminal 36 (that is, external clock signal REF), the potential applied to input terminal 37 (that is, internal clock signal OSC), output of 2-input NAND gate 40 (that is, signal φ1), output of 2-input NAND gate 45 (that is, signal φ4), output of 4-input NAND gate 48 (that is, reset signal RES), output of 3-input NAND gate 46 (that is, signal UP), and output of 3-input NAND gate 47 (that is, signal DOWN).

Before referring to FIG. 7, consideration is made for a situation in which external clock signal REF and internal clock signal OSC are both at "L" level. At this time, both of gates 40 and 45 always output an "H" level. Assuming that outputs of gates 41 and 44 are at "H" level, output of gate 48 would be at "L" level and outputs of gates 42 and 43 would be at "H" level. As a result, outputs of gates 41 and 44 would be at "L" level. Accordingly, it would be understood that outputs of gates 46 and 47 will always output "H" level as long as both of external clock signal REF and internal clock signal OSC are at "L" level. If external clock signal REF and internal clock signal OSC then turn to "H" level, outputs of gates 40 and 45 attain "L" level so that gates 41 and 44 would output "H" level.

Then, description is made for a situation in which external clock signal REF falls first, followed by the fall of internal clock signal OSC delayed by phase T1, as shown in FIG. 7. Corresponding to the fall of external clock signal REF, output of gate 40 changes to "H" level. However, since internal clock signal OSC is still at "H" level, output of gate 45 would be maintained at "L" level and output of gate 48 does not change from "H" level. Accordingly, output of gate 46 turns to "L" level. Meanwhile, output of gate 47 does not change from "H" level.

Thereafter, when internal clock signal OSC falls, output of gate 45 turns to "H" level while all four inputs of gate 48 attain "H" level, and transition to "L" level occurs at output of gate 48. As a result, output of gate 46 is turned again from "L" level to "H" level and a pulse signal is output which reflects the phase difference between external clock signal REF and internal clock signal OSC. Although the output of gate 47 turns to "L" level upon the change of the output of gate 45 to "H" level, change of the output of gate 48 to "L" level immediately follows so as to pull back the output of gate 47 to "H" level. Accordingly, gate 47 outputs a pulse signal with a constant width regardless of the phase difference between external clock signal REF and internal clock signal OSC.

Figure 8:
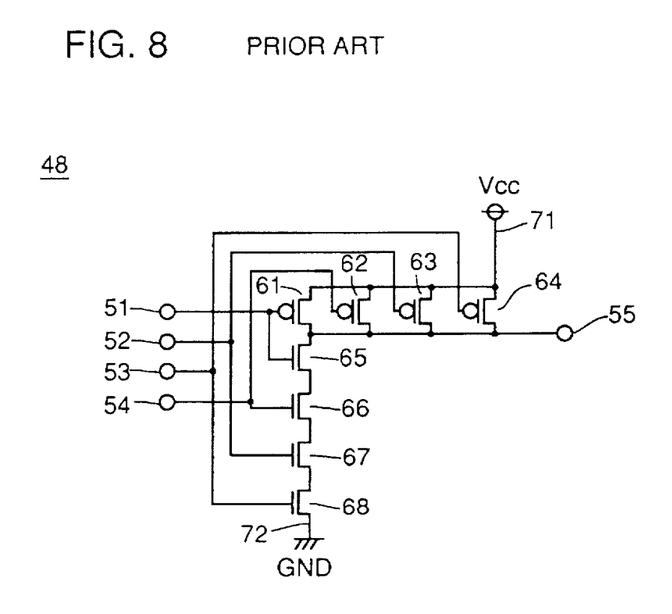
FIG. 8 is a circuit diagram showing a structure of a 4-input NAND gate in the phase comparator shown in FIG. 6.

FIG. 8 is a circuit diagram illustrating the structure of the 4-input NAND gate 48 when it is formed by CMOS (Complementary Metal Oxide Semiconductor) transistors. In the figure, this 4-input NAND gate 48 includes four input nodes 51 to 54, an output node 55, four P channel MOS transistors 61 to 64, and four N channel MOS transistors 65 to 68. P channel MOS transistors 61 to 64 are connected in parallel with one another between a power supply potential line 71 and output node 55, respectively. N channel MOS transistors 65 to 68 are connected in series between output node 55 and ground potential line 72. Transistors 61 and 65, 62 and 66, 63 and 67, and 64 and 68 have their gates commonly connected to one another as well as to input nodes 51, 54, 52, and 53, respectively.

When all four input nodes 51 to 54 have attained "H" level, four N channel MOS transistors 65 to 68 are turned on while four P channel MOS transistors 61 to 64 are turned off, and "L" level (ground potential GND) is output to output node 55. At other situations, at least one of the four N channel MOS transistors 65 to 68 would be non-conductive while at least one of the four P channel MOS transistors 61 to 64 being conductive, and "H" level (power supply potential Vcc) is output to output node 55.

Since the conventional phase comparator 31 is formed as described above, pulse width of signals UP and DOWN depends on the delay of multiple input gate which generates reset signal RES. However, as shown in FIG. 8, when the multiple input gate 48 is formed by CMOS transistors, existence of transistors 65 to 68 connected in series would cause difference between the delay times depending upon the input of multiple input gate 48. In such a phase comparator 31, the timing upon which reset signal RES is output depends on whether the fall of internal clock signal OSC is in advance of or lags behind the fall of external clock signal REF, and as a result, the pulse width of signals UP and DOWN will not be identical even when the phase difference is the same.

Accordingly, the gain of the entire PLL circuit 30 (that is, the amount of the phase pulled back by PLL circuit 30 with respect to the phase difference) would be different depending on whether the phase of internal clock signal OSC leads or lags, such that jitter of internal clock signal OSC would be increased when synchronized.

SUMMARY OF THE INVENTION

Based upon the foregoing, it is a principle object of the present invention to provide a phase comparator which can output control signals of an identical pulse width when the phase difference between first and second clock signals is the same, regardless of which of the clock signals has a phase leading the other.

In the phase comparator according to the present invention, briefly speaking, a reset signal generating circuit includes first and second transistors which become conductive corresponding to an output of a first control signal from a first signal generating circuit, and third and fourth transistors which become conductive corresponding to an output of a second control signal from a second signal generating circuit, and outputs a reset signal through first and third transistors and outputs a reset signal through the fourth and second transistors in response to output of the first and second control signals. Accordingly, the delay time between the output of first and second control signals and the output of a reset signal can be made constant regardless of which of the first and the second control signals has been output first. Therefore, control signals of an identical pulse width can be output as long as the phase difference between the first clock signal and the second clock signal is the same, regardless of which of the clock signals has the phase leading the other.

In addition, the reset signal generating circuit can be formed easily if it is adapted to include a first logic circuit having first and third transistors and fourth and second transistors connected in series between second potential line and an output node, respectively.

Furthermore, first and second signal generating circuits can be formed easily if each of them is formed of two flip-flops.

In addition, if the reset signal generating circuit is adapted to include a first activating circuit for activating the first logic circuit in response to the change of the outputs of first and fourth flip-flops from the second potential to the first potential, the reset signal can be output only when the outputs of first and fourth flip-flops are both changed from the second potential to the first potential.

If the first activating circuit is adapted to include a first connecting circuit connected between the first transistor and the second potential line as well as a second connecting circuit connected between the fourth transistor and the second potential line, the first logic circuit is activated only when the first and second connecting circuits have become conductive.

When a connection node between the first transistor and the first connecting circuit and a connection node between the fourth transistor and the second connecting circuit are connected to one another, the resistance between the connection nodes and the second potential line can be reduced.

When the first activating circuit includes a first gate circuit for selectively applying the output of the first logic circuit to first or fourth flip-flop, the first logic circuit is activated only when the first gate circuit is open.

Furthermore, the reset signal generating circuit can be formed easily if it is adapted to include a second logic circuit having first and third transistors and second transistors connected in series between a first potential line and the output node, respectively.

First and second signal generating circuits can be formed easily if they are formed of two flip-flops, respectively.

If the second logic circuit includes a second activating circuit for activating the second logic circuit in response to the change of the outputs of second and fourth flip-flops from a second potential to a first potential, the reset signal can be output only when both of the outputs of the second and fourth flip-flops are changed from the second potential to the first potential.

When the second activating circuit includes second and third gate circuits for selectively applying the outputs of the first and third flip-flops to the second logic circuit, the second logic circuit is activated only when the second and third gate circuits are open.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EMBODIMENT 1

Figure 1:
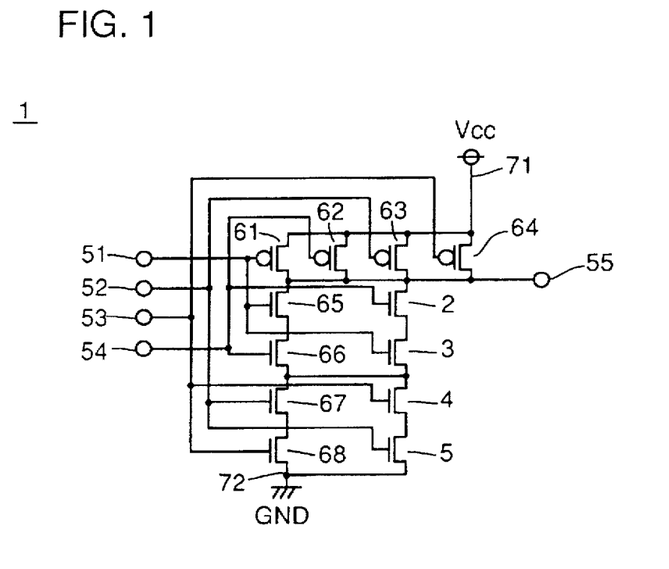
FIG. 1 is a circuit diagram showing a structure of a 4-input NAND gate in a phase comparator according to a first embodiment of the present invention.

FIG. 1 is a circuit diagram showing a structure of a 4-input NAND gate 1 in a phase comparator according to a first embodiment of the present invention. 4-input NAND gate 1 corresponds to the 4-input NAND gate 48 shown in FIGS. 6 and 8.

Referring to FIG. 1, this 4-input NAND gate 1 differs from the conventional 4-input NAND gate 48 of FIG. 8 in that it is newly provided with N channel MOS transistors 2 to 5. Among these transistors, at least N channel MOS transistors 2 and 65, as well as 3 and 66 are of identical size. N channel MOS transistors 2 to 5 are connected in series between an output node 55 and a ground potential line 72. The gates of N channel MOS transistors 2 to 5 are connected to input nodes 54, 51, 53, and 52, respectively. In addition, N channel MOS transistor 3 has its source connected to the source of N channel MOS transistor 66.

The operation of the 4-input NAND 1 shown in FIG. 1 will be described next. When external clock signal REF falls first, "H" level is applied to input nodes 51, 52, and 53, while "L" level is applied to input node 54. Accordingly, N channel MOS transistors 65, 67, 68, 3 to 5, and a P channel MOS transistor 62 become conductive and N channel MOS transistors 66 and 2 and P channel MOS transistors 61, 63, and 64 become non-conductive, so that "H" level is continuously output to output node 55.

Then, if internal clock signal OSC falls delayed by phase T1, input node 54 is turned to "H" level. Accordingly, P channel MOS transistor 62 is rendered non-conductive while N channel MOS transistors 66 and 2 are rendered conductive, so that "L" level appears at output node 55.

Meanwhile, if internal clock signal OSC falls first, "H" level is applied to input nodes 52 to 54 while "L" level is applied to input node 51. Accordingly, N channel MOS transistors 66 to 68, 2, 4, and 5, and P channel MOS transistor 61 become conductive and N channel MOS transistors 65, 3 and P channel MOS transistors 62 to 64 become non-conductive so that "H" level continues to be output to output node 55.

Thereafter, if external clock signal REF falls delayed by phase T1, input node 51 attains "H" level. Accordingly, P channel MOS transistor 61 is rendered non-conductive while N channel MOS transistors 65 and 3 are rendered conductive. As a result, "L" level appears at output node 55.

In this embodiment, N channel MOS transistors 2 and 3 are connected in parallel to N channel MOS transistors 65 and 66 while the gates of N channel MOS transistors 65 and 3 as well as 66 and 2, respectively, are commonly connected, and the size of N channel MOS transistors 65 and 2 as well as the size of N channel MOS transistors 66 and 3, respectively, are made equal. Accordingly, the time taken for output node 55 to attain "L" level after N channel MOS transistors 66 and 2 are rendered conductive would be equal to time taken for output node 55 to attain "L" level after N channel MOS transistors 65 and 3 are rendered conductive. As a result, the pulse width of signal UP and the pulse width of signal DOWN would be identical to one another if the phase difference between internal clock signal OSC and external clock signal REF is the same, regardless of whether the phase of internal clock signal OSC is in advance or lags behind.

Figure 2:
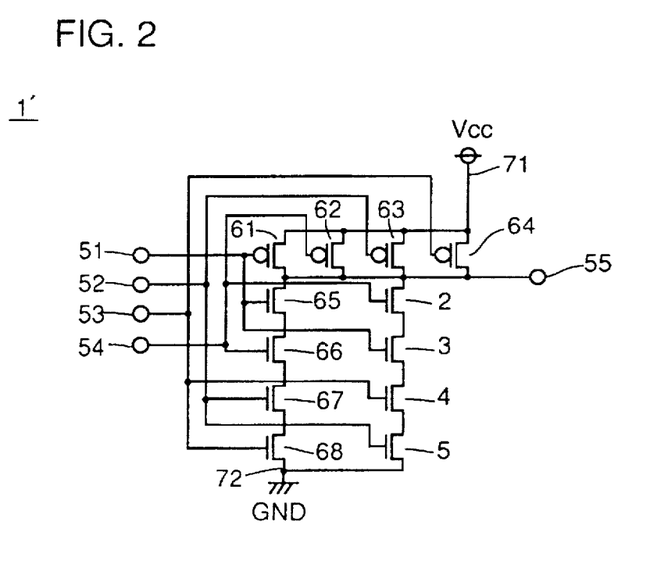
FIG. 2 is a circuit diagram showing an improved example of the 4-input NAND gate shown in FIG. 1.

Although the sources of N channel MOS transistors 3 and 66 are connected to one another in this embodiment, these sources of N channel MOS transistors 3 and 66 may be separated, as shown in FIG. 2. In that case, however, the serial resistance of N channel MOS transistors 67 and 68, and the serial resistance of N channel MOS transistors 4 and 5 must be equal.

EMBODIMENT 2

Figure 3:
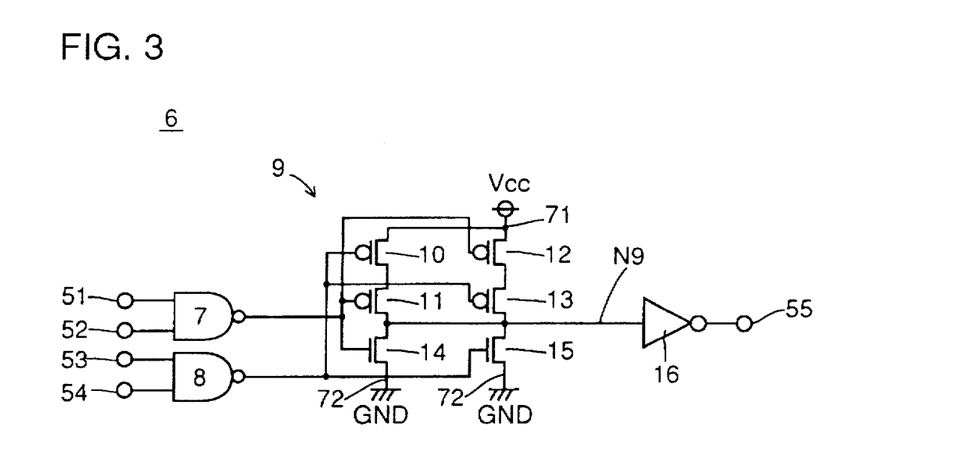
FIG. 3 is a circuit diagram showing a structure of a 4-input NAND gate 6 in a phase comparator according to a second embodiment of the present invention.

FIG. 3 is a circuit diagram showing a structure of a 4-input NAND gate 6 in a phase comparator according to a second embodiment of the present invention. Referring to FIG. 3, this 4-input NAND gate 6 includes 2-input NAND gates 7 and 8, a 2-input NOR gate 9, and an inverter 16. NOR gate 9 includes P channel MOS transistors 10 to 13 and N channel MOS transistors 14 and 15. P channel MOS transistors 10 and 12 as well as 11 and 13, respectively, are of identical size.

Two input nodes of NAND gate 7 would be input nodes 51 and 52 of NAND gate 6, respectively. Two input nodes of NAND gate 8 would be input nodes 53 and 54 of NAND gate 6, respectively.

P channel MOS transistors 10 and 11 are connected in series between a power supply potential line 71 and an output node N9 of NOR gate 9. P channel MOS transistors 12 and 13 are connected in series between power supply potential line 71 and output node N9. N channel MOS transistors 14 and 15 are connected in series with one another between output node N9 and a ground potential line 72, respectively. The gates of transistors 10, 13, and 15 receive an output of NAND gate 8. Gates of transistors 11, 12, and 14 receive an output from NAND gate 7. Inverter 16 is connected between nodes N9 and 55.

The operation of 4-input NAND gate 6 shown in FIG. 3 is similar to that of the 4-input NAND gate shown in FIG. 1. If external clock signal REF falls first, "H" level is applied to input nodes 51 to 53 while "L" level is applied to input node 54 so that output of 2-input NAND gate 7 would be at "L" level and output of 2-input NAND gate 8 would be at "H" level. As a result, P channel MOS transistors 11, 12 and N channel MOS transistor 15 are made conductive and P channel MOS transistors 10, 13 and N channel MOS transistor 14 are made non-conductive. "L" level is applied to input node of inverter 16 and "H" level appears at output node 55. When internal clock signal OSC falls delayed by phase T1, input node 54 turns to "H" level so that the output of 2-input NAND gate 8 would attain "L" level, N channel MOS transistor 15 is rendered non-conductive, and P channel MOS transistors 10, 13 are rendered conductive. As a result, input node of inverter 16 attains "H" level, and output node 55 is changed to be at "L" level.

Meanwhile, if internal clock signal OSC falls first, "H" level is applied to input nodes 52 to 54 and "L" level is applied to input node 51. Accordingly, output of 2-input NAND gate 7 would be at "H" level, and output of 2-input NAND gate 8 would be at "L" level. As a result, P channel MOS transistors 10, 13 and N channel MOS transistor 14 are made conductive, while P channel MOS transistors 11, 12 and N channel MOS transistor 15 are made non-conductive so that "L" level is similarly applied to input node of inverter 16. If external clock signal REF falls delayed by the phase T1, input node 51 turns to "H" level so that output of 2-input NAND gate 7 would be at "L" level, and N channel MOS transistor 15 is rendered non-conductive while P channel MOS transistors 11 and 12 are rendered conductive. Consequently, input node of inverter 16 attains "H" level and output node 55 is changed to "L" level.

In this embodiment, P channel MOS transistors 10, 11 and P channel MOS transistors 12, 13 are connected in parallel, respective gates of P channel MOS transistors 10 and 13 as well as 11 and 12 are connected commonly, and the sizes of P channel MOS transistors 10 and 12 as well as 11 and 13 are made equal. Therefore, the time necessary for output node 55 to attain "L" level after P channel MOS transistors 11, 12 has become conductive and the time necessary for output node 55 to attain "L" level after P channel MOS transistors 10, 13 have become conductive are made equal so as to obtain an effect similar to that of the first embodiment.

EMBODIMENT 3

Figure 4:
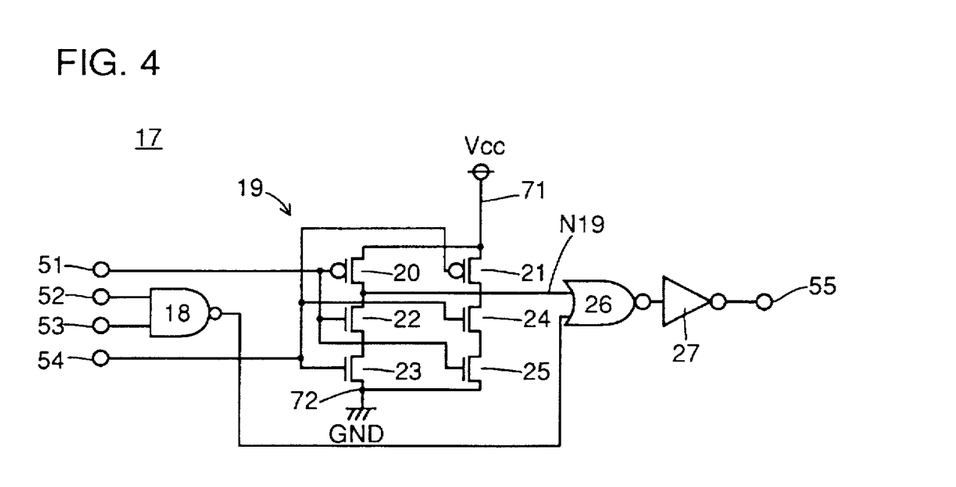
FIG. 4 is a circuit diagram showing a structure of a 4-input NAND gate 17 in a phase comparator according to a third embodiment of the present invention.

FIG. 4 is a circuit diagram showing a structure of a 4-input NAND gate 17 in a phase comparator according to a third embodiment of the present invention. Referring to FIG. 4, this 4-input NAND gate 17 includes 2-input NAND gates 18, 19, a 2-input NOR gate 26, and an inverter 27. NAND gate 19 includes P channel MOS transistors 20, 21, and N channel MOS transistors 22 to 25. N channel MOS transistors 22 and 24 as well as 23 and 25, respectively, are of identical transistor size.

Two input nodes of NAND gate 18 would be input nodes 52 and 53 of NAND gate 17, respectively. P channel MOS transistors 20, 21 are connected in parallel with each other between a power supply potential line 71 and an output node N19 of NAND gate 19, respectively. N channel MOS transistors 22, 23 are connected in series between output node N19 and a ground potential line 72. N channel MOS transistors 24, 25 are connected in series between output node N19 and ground potential line 72. NOR gate 26 receives outputs from NAND gates 18 and 19. Inverter 27 receives output from NOR gate 26. The output node of inverter 27 would be an output node 55 of NAND gate 17.

The operation of the circuit will now be described. If external clock signal REF falls first, "H" level is applied to input node 51 to 53 and "L" level is applied to input node 54. Accordingly, output of 2-input NAND gate 18 would be at "L" level, and the output of NAND gate 19 would be output as it is to output node 55. In addition, N channel MOS transistors 22, 25 and P channel MOS transistor 21 are made conductive while N channel MOS transistors 23, 24 and P channel MOS transistor 20 are made non-conductive so that "H" level appears at output node 55. If internal clock signal OSC falls delayed by phase T1, input node 54 turns to "H" level so that P channel MOS transistor 21 is rendered non-conductive while N channel MOS transistors 23, 24 are rendered conductive. Thus, output node 55 would turn to "L" level.

Meanwhile, if internal clock signal OSC falls first, "H" level is applied to input nodes 52 to 54 while "L" level is applied to input node 51, so that the output of 2-input NAND gate 18 would attain "L" level, and the output of NAND gate 19 would be output as it is to output node 55. In addition, N channel MOS transistors 23, 24 and P channel MOS transistor 20 are made conductive while N channel MOS transistors 22, 25 and P channel MOS transistor 21 are made non-conductive, so that "H" level appears at output node 55. If external clock signal REF falls delayed by phase T1, input node 51 turns to "H" level. Accordingly, P channel MOS transistor 20 is rendered non-conductive while N channel MOS transistors 22, 25 are rendered conductive, and thus output node 55 is altered to "L" level.

An effect similar to that of the first embodiment and the second embodiment is also obtained in the present embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase comparator for comparing a first clock signal and a second clock signal and outputting a first control signal in response to lead of the phase of the first clock signal and outputting a second control signal in response to lead of the phase of the second clock signal, comprising:

a first signal generator for outputting said first control signal in response to change of said first clock signal from a first potential to a second potential;

a second signal generator for outputting said second control signal in response to change of said second clock signal from the first potential to the second potential; and a reset signal generator for outputting a reset signal to said first and second signal generators, said reset signal changing from inactivation potential to activation potential in response to change of the both of said first and second clock signals from the first potential to the second potential, wherein said first signal generator stops outputting said first control signal and said second signal generator stops outputting said second control signal in response to change of said reset signal from said inactivation potential to said activation potential;

said reset signal generator includes an output node connected to said first and second signal generators, first and second transistors connected in a first series between said output node and an activation potential line to which said activation potential is applied, said first and second transistors each including first and second electrodes with the first electrode of the first transistor directly connected to the output node and the second electrode of the first transistor directly connected to the first electrode of the second transistor, and third and fourth transistors connected in a second series, parallel to the first series, between said output node and said activation potential line, said third and fourth transistors each including first and second electrodes with the first electrode of the third transistor directly connected to the output node and the second electrode of the third transistor directly connected to the first electrode of the fourth transistor, said first and fourth transistors being rendered conductive in response to change of said first clock signal from the first potential to the second potential and said second and third transistors being rendered conductive in response to change of said second clock signal from the first potential to the second potential, so that time for said output node to change from said inactivation potential to said activation potential when said first and fourth transistors are rendered conductive first and then said second and third transistors are rendered conductive is equal to the time for said output node to change from said inactivation potential to said activation potential when said second and third transistors are rendered conductive first and then said first and fourth transistors are rendered conductive;

said first signal generator includes a first flip-flop which is set by said first clock signal and reset by said reset signal, and a second flip-flop which is set by output of said first flip-flop and reset by said reset signal;

said second signal generator includes a third flip-flop which is set by said second clock signal and reset by said reset signal, and a fourth flip-flop which is set by output of said third flip-flop and reset by said reset signal, said first and fourth transistors of said reset signal generator being rendered conductive in response to said first flip-flop being set and said second and third transistors being rendered conductive in response to said third flip-flop being set;

said reset signal generator further includes a first connecting means directly connected between the second electrode of said second transistor and said activation potential line, a second connecting means directly connected between the second electrode of said fourth transistor and said activation potential line, the second electrode of the second transistor being directly connected also to the second electrode of the fourth transistor, said first and second connecting means each being rendered conductive in response to the both of said second and fourth flip-flops being set, and fifth to eighth transistors each directly connected between an inactivation potential line to which said inactivation potential is applied and said output node, said first to fourth transistors are of a first conductivity type and the fifth to eighth transistors are of a second conductivity type, different from the first conductivity type, said fifth transistor being rendered non-conductive in response to the first flip-flop being set, said sixth transistor being rendered non-conductive in response to the third flip-flop being set, said seventh transistor being rendered non-conductive in response to the second flip-flop being set, and said eight transistor being rendered non-conductive in response to the fourth flip-flop being set.

2. A phase comparator for comparing a first clock signal and a second clock signal and outputting a first control signal in response to lead of the phase of the first clock signal and outputting a second control signal in response to lead of the phase of the second clock signal, comprising:

a first signal generator for outputting said first control signal in response to change of said first clock signal from a first potential to a second potential;

a second signal generator for outputting said second control signal in response to change of said second clock signal from the first potential to the second potential; and a reset signal generator for outputting a reset signal to said first and second signal generators, said reset signal changing from inactivation potential to activation potential in response to change of the both of said first and second clock signals from the first potential to the second potential, wherein said first signal generator stops outputting said first control signal and said second signal generator stops outputting said second control signal in response to change of said reset signal from said inactivation potential to said activation potential;

said reset signal generator includes an output node connected to said first and second signal generators, first to fourth transistors connected in series between said output node and an activation potential line to which said activation potential is applied, fifth to eighth transistors connected in series between said output node and said activation potential line, each of said first to eight transistors having first and second electrodes, the first electrode of the first transistor being directly connected to the output node, the second electrode of the first transistor being directly connected to the first electrode of the second transistor, the second electrode of the second transistor being directly connected to the first electrode of the third transistor, the second electrode of the third transistor being directly connected to the first electrode of the fourth transistor, the second electrode of the fourth transistor being directly connected to said activation potential line, the first electrode of the fifth transistor being directly connected to the output node, the second electrode of the fifth transistor being directly connected to the first electrode of the sixth transistor, the second electrode of the sixth transistor being directly connected to the first electrode of the seventh transistor, the second electrode of the seventh transistor being directly connected to the first electrode of the eighth transistor, and the second electrode of the eighth transistor being directly connected to said activation potential line, said first and sixth transistors being rendered conductive by a first common signal, said second and fifth transistors being rendered conductive by a second common signal, said third and eighth transistors being rendered conductive by a third common signal, and said fourth and seventh transistors being rendered conductive by a fourth common signal, with time for the first electrode of seventh transistor to change from said inactivation potential to said activation potential when said third and eighth transistors are first rendered conductive in response to said third common signal followed by said fourth and seventh transistors rendered conductive in response to said fourth common signal being equal to the time for the first electrode of said third transistor to change from said inactivation potential to said activation potential when said fourth and seventh transistors are first rendered conductive in response to said third common signal followed by said third and eighth transistors rendered conductive in response to said third common signal, and ninth to twelfth transistors each directly connected between the output node and an inactivation potential line;

said first signal generator includes a first flip-flop which is set by said first clock signal and reset by said reset signal, and a second flip-flop which is set by output of said first flip-flop and reset by said reset signal; and said second signal generator includes a third flip-flop which is set by said second clock signal and reset by said reset signal, and a fourth flip-flop which is set by output of said third flip-flop and reset by said reset signal, said first to eighth transistors being of a first conductivity type and the ninth to twelfth transistors being of a second conductivity type, different from the first conductivity type, said first and sixth transistors being rendered conductive in response to change of said first clock signal from the first potential to the second potential to set the first flip-flop, said second and fifth transistors being rendered conductive in response to change of said second clock signal from the first potential to the second potential to set the third flip-flop, said third and eight transistors being rendered conductive in response to the second flip-flop being set, the fourth and seventh transistors being rendered conductive in response to the fourth flip-flop being set, said ninth transistor being rendered non-conductive in response to the first flip-flop being set, the tenth transistor being rendered non-conductive in response to the third flip-flop being set, the eleventh transistor being rendered non-conductive in response to the second flip-flop being set, and the twelfth transistor being rendered non-conductive in response to the fourth flip-flop being set.

* * * * *